US008632689B2

(12) United States Patent
Merry

(10) Patent No.: US 8,632,689 B2
(45) Date of Patent: Jan. 21, 2014

(54) TEMPERATURE CONTROL WITH STACKED PROPORTIONING VALVE

(71) Applicant: Walter R. Merry, Sunnyvale, CA (US)

(72) Inventor: Walter R. Merry, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/652,147

(22) Filed: Oct. 15, 2012

(65) Prior Publication Data

US 2013/0105442 A1 May 2, 2013

Related U.S. Application Data

(60) Provisional application No. 61/552,356, filed on Oct. 27, 2011.

(51) Int. Cl.
G01L 21/30 (2006.01)
G01R 31/00 (2006.01)

(52) U.S. Cl.
USPC ........................................ 216/59; 137/625.46

(58) Field of Classification Search
USPC ........... 216/59; 236/12.1; 137/625.46, 625.47
See application file for complete search history.

(56) References Cited

U.S. PATENT DOCUMENTS 6,681,805 B2 * 1/2004 McLane et al. .......... 137/625.47

* cited by examiner

Primary Examiner — Roberts Culbert
(74) Attorney, Agent, or Firm — Blakely, Sokoloff, Taylor & Zafman LLP

(57) ABSTRACT

A stacked proportioning valve having a body with at least two sets of ports disposed at different positions along a longitudinal length of the body, each set of ports including at least three ports at different angular positions to couple to fluid conduits, a rotor disposed in the valve body has at least two sections stacked along the longitudinal length, each section comprising three fluid channels in longitudinal alignment with one of the sets of ports, and a drive shaft affixed to the rotor, the drive shaft to rotate the rotor over angular positions to fluidly couple together pairs of ports in each of the sets of ports synchronously as a function of the rotor's angular position. In embodiments a component of a plasma processing chamber, such as a plasma etch chamber is fluidly coupled by the stack proportioning valve to reservoirs of both a hot and cold chiller.

20 Claims, 10 Drawing Sheets

US 8,632,689 B2

TEMPERATURE CONTROL WITH STACKED PROPORTIONING VALVE

CROSS-REFERENCE TO RELATED APPLICATIONS

This application claims the benefit of U.S. Provisional Application No. 61/552,356 filed on Oct. 27, 2011 titled "TEMPERATURE CONTROL WITH STACKED PROPORTIONING VALVE," the content of which is hereby incorporated by reference in its entirety for all purposes.

TECHNICAL FIELD

Embodiments of the present invention generally relate to plasma processing equipment, and more particularly to methods of controlling temperatures during processing of a workpiece with a plasma processing chamber.

BACKGROUND

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode or other component may also be controlled during the process recipe to influence the processing. Conventionally, a heat sink and/or heat source is coupled to the processing chamber to maintain the temperature of a chamber component at a desired temperature. To accommodate increasingly complex film stacks, many plasma processes expose a workpiece to a number of sequential plasma conditions within a same processing chamber. Operations in such in-situ recipes (performed within a single manufacturing apparatus rather than in separately tuned systems) may require temperature setpoints spanning a wide range.

BRIEF DESCRIPTION OF THE DRAWINGS

Embodiments of the present invention are illustrated by way of example, and not limitation, in the figures of the accompanying drawings in which.

DETAILED DESCRIPTION

In the following detailed description, numerous specific details are set forth in order to provide a thorough understanding of embodiments of the invention. However, it will be understood by those skilled in the art that other embodiments may be practiced without these specific details. In other instances, well-known methods, procedures, components and circuits have not been described in detail so as not to obscure the present invention. Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" my be used to indicated that two or more elements are in either direct or indirect (with other intervening elements between them) physical or electrical contact with each other, and/or that the two or more elements co-operate or interact with each other (e.g., as in a cause an effect relationship).

Figure 1:
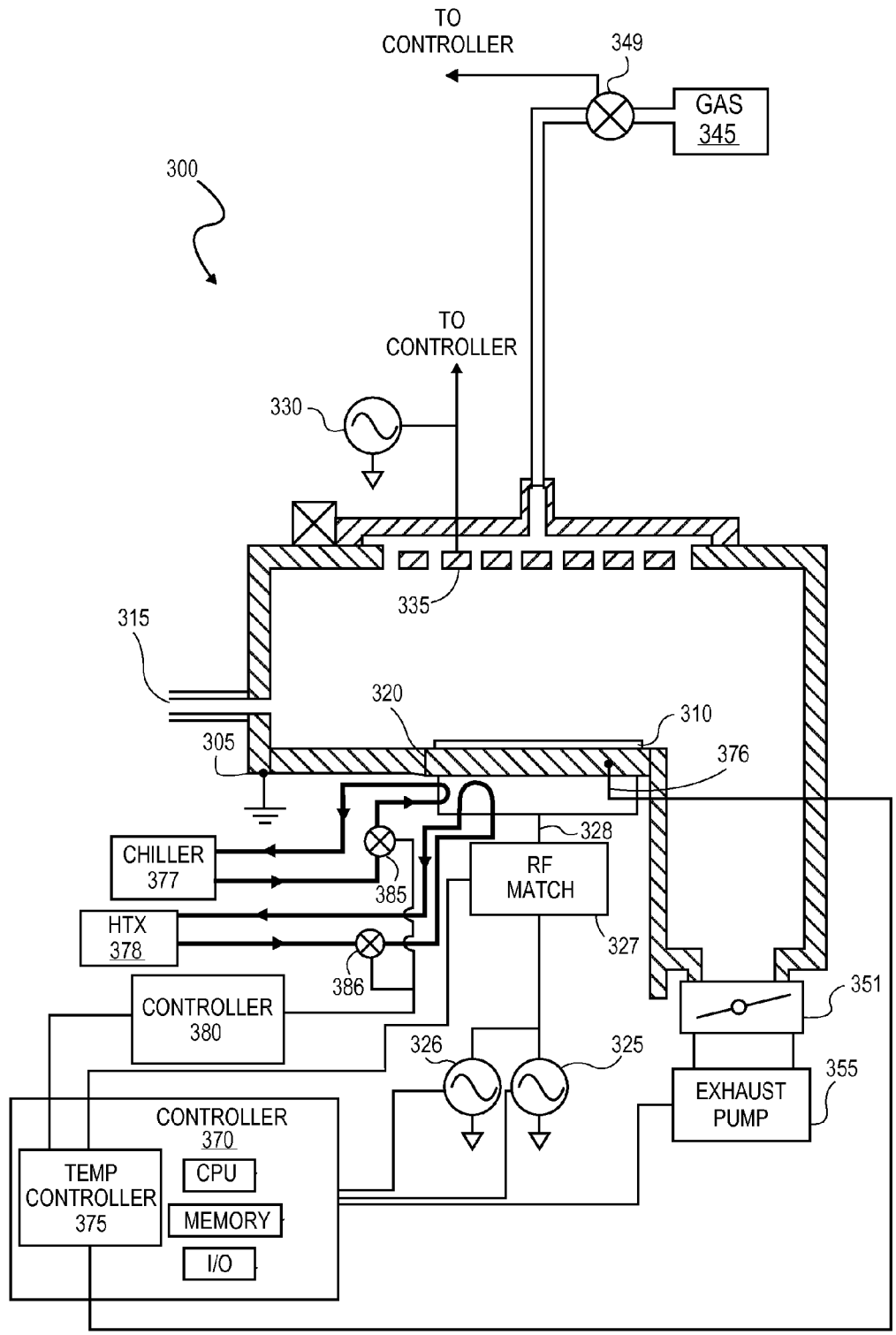
FIG. 1 illustrates a schematic of a plasma etch system including a heat transfer fluid-based heat source and a heat transfer fluid-based heat sink coupled to a workpiece supporting chuck.

FIG. 1 illustrates a cross-sectional schematic view of a plasma etch system 300 which includes a component for which temperature is controlled. The plasma etch system 300 may be any type of high performance etch chamber known in the art, such as, but not limited to, Enabler™, MxP®, MxP+™, Super-E™, DPS II AdvantEdge™ G3, or E-MAX® chambers manufactured by Applied Materials of CA, USA. Other commercially available etch chambers may be similarly controlled. While the exemplary embodiments are described in the context of the plasma etch system 300, it should be further noted that the temperature control system architecture described herein is also adaptable to other plasma processing systems (e.g., plasma deposition systems, etc.) which present a heat load on a temperature controlled component.

The plasma etch system 300 includes a grounded chamber 305. A substrate 310 is loaded through an opening 315 and clamped to a temperature controlled electrostatic chuck 320. The substrate 310 may be any workpiece conventionally employed in the plasma processing art and the present invention is not limited in this respect. In particular embodiments, temperature controlled chuck 320 includes a plurality of zones, each zone independently controllable to a temperature setpoint which may be the same or different between the zones. In the exemplary embodiment, an inner thermal zone is proximate a center of substrate 310 and an outer thermal zone is proximate to a periphery/edge of substrate 310 with a temperature sensing probe 376 disposed within each zone and communicatively coupled to a temperature controller 375, which in the exemplary embodiment is a component of a system controller 370 responsible for automation of the system 300. Process gases, are supplied from gas source 345 through a mass flow controller 349 to the interior of the chamber 305. Chamber 305 is evacuated via an exhaust valve 351 connected to a high capacity vacuum pump stack 355.

When plasma power is applied to the chamber 305, a plasma is formed in a processing region over substrate 310. A first plasma bias power 325 is coupled to the chuck 320 (e.g., cathode) via an RF input 328 to energize the plasma. The plasma bias power 325 typically has a low frequency between about 2 MHz to 60 MHz, and in a particular embodiment, is in the 13.56 MHz band. In the exemplary embodiment, the plasma etch system 300 includes a second plasma bias power 326 operating at about the 2 MHz band which is connected to the same RF match 327 as plasma bias power 325 to provide a dual frequency bias power. In one dual frequency bias power embodiment a 13.56 MHz generator supplies between 500 W and 3000 W while a 2 MHz generator supplies between 0 and 7000 W of power for a total bias power ($W_{b,tot}$) of between 500 W and 10000 W. In another dual frequency bias power embodiment a 60 MHz generator supplies between 100 W and 3000 W while a 2 MHz generator supplies between 0 and 7000 W of power for a total bias power ($W_{b,tot}$) of between 100 W and 10000 W.

A plasma source power 330 is coupled through a match (not depicted) to a plasma generating element 335 (e.g., showerhead) which may be anodic relative to the chuck 320 to provide high frequency source power to energize the plasma. The plasma source power 330 typically has a higher frequency than the plasma bias power 325, such as between 100 and 180 MHz, and in a particular embodiment, is in the 162 MHz band. In particular embodiments the top source operates between 100 W and 2000 W. Bias power more directly affects the bias voltage on substrate 310, controlling ion bombardment of the substrate 310, while source power more directly affects the plasma density. Notably, the system component to be temperature controlled by a temperature controller 375 is neither limited to the chuck 320 nor must the temperature controlled component directly couple a plasma power into the process chamber. In an alternative embodiment for example, a showerhead through which a process gas is input into the plasma process chamber is controlled with the temperature controller 375. For such showerhead embodiments, the showerhead may or may not be RF powered.

For a high bias power density (kW/workpiece area) embodiment, such as that applicable to dielectric etching, it is problematic to supply heating power to the chuck 320 via a resistive heater because of RF filtering issues. For the system 300, the chuck heating power is provided by a heat transfer fluid loop. For such embodiments, a first heat transfer fluid loop cools the chuck 320 and a second heat transfer fluid loop heats the chuck 320. In the exemplary embodiment, the temperature controller 375 is coupled, either directly, or indirectly to a chiller 377 (heat sink) and a heat exchanger 378 (heat source). The temperature controller 375 may acquire the temperature setpoint of the chiller 377 or the heat exchanger (HTX) 378. A difference between the temperature of the chiller 377 and a temperature setpoint for the chuck 320 and the difference between the temperature of the heat exchanger 378 and the temperature setpoint is input into a feedforward or feedback control line along with the plasma power (e.g., total bias power). The chiller 377 is to provide a cooling power to the chuck 320 via a coolant loop thermally coupling the chuck 320 with the chiller 377. In the exemplary embodiment therefore, two coolant loops are employed. One coolant loop has a cold liquid (e.g., Galden or Fluorinert, etc. at a temperature setpoint of −5° C. while another loop contains liquid at high temperature (e.g., Galden or Fluorinert, etc. at a temperature setpoint of 55° C.). When cooling is required a valve 385 is opened while a valve 386 for the heating loop is opened when heating is required. In preferred embodiments, only one of the heating and cooling valves 385 and 386 is open at any particular time such that a total fluid flow to the chuck 320 at any given time is delivered from either the chiller 377 or the HTX 378.

FIG. 2A illustrates a schematic of valving and plumbing manifolds 361 for the heat transfer fluid-based heat source/sink employed in the plasma etch system of FIG. 1, in accordance with an embodiment of the present invention. As further depicted, a pair of heat transfer fluid supply lines 381 and 382 are coupled to the chiller 377 and a heat transfer fluid channel embedded in the chuck 320 (subjacent to a working surface of the chuck upon which substrate 310 is disposed during processing) via the valves 385 (EV 4 and EV 3, respectively). The line 381 is coupled to a heat transfer fluid channel embedded subjacent to a first, outer zone, of the chuck working surface while the line 382 is coupled to a heat transfer fluid channel embedded subjacent to a second, inner zone, of the chuck working surface to facilitate dual zone cooling. Similarly, the line 381 and 382 also couples the chuck 320 to the HTX 378 via the valves 386 (EV2 and EV1, respectively) to facilitate dual zone heating. Return lines 383A complete the coupling of each of the inner and outer zone heat transfer fluid channels to the chiller/HTX, 377/378 via return valves EV3 and EV1.

During operation, because each of the hot and cold coolant loops is tapped to control the chuck temperature, differences in the amount of fluid which is returned from the chuck 320 to the reservoirs in the chiller 377 and HTX 387 may occur. Even where the individual valves 385 and 386 are operated completely out of phase, small differences in individual valve actuation rates may result in a net migration of heat transfer fluid from one of the chiller and HTX 377,378 to the other of the chiller and HTX 377, 378. A means to neutralize that net migration would then be needed.

Figure 3:
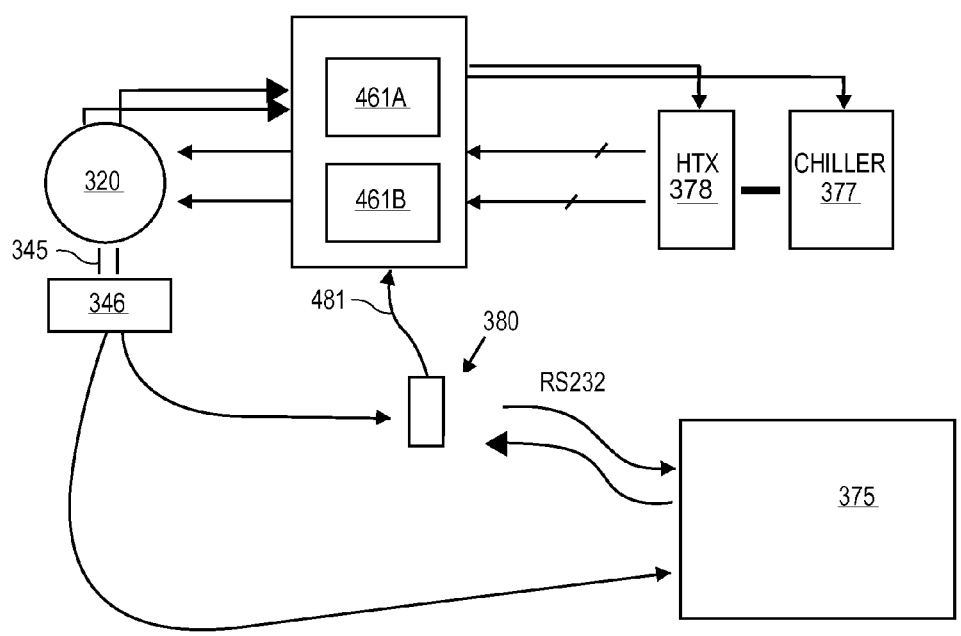
FIG. 3 is a schematic illustrating an embodiment of the present invention in which the function of the manifolds depicted in FIG. 2 are integrated by two stacked proportioning valves.

FIG. 3 is a schematic illustrating an embodiment of the present invention in which the function of the manifolds 361 are integrated by two stacked proportioning valves 461A and 461B for switching heat transfer fluid from the chiller 377 and HTX 378 to each of the inner and outer coolant channels of the cathode (chuck) 320. As shown in FIG. 3, heat transfer fluid lines from the chiller 377 and HTX 378 feed into each of the stacked proportioning valves 461A and 461B, heat transfer fluid lines couple output ports of the valves 461A and 461B to the inputs for each zone in the chuck 320. Temperature probes in the chuck 320 (e.g., 376 in FIG. 1) output a measured chuck temperature. In the exemplary embodiment where the temperature probes are fiber optic probes, probe output is passed through a photon converter (counter) 346 and then relayed to the temperature controller 375 and/or the controller 380 responsible for outputting a drive signal 481 to the stacked proportioning valves 461A and 461B. Controller 380 may be any conventional temperature controller, such as but not limited to those commercially available from Azbil/Yamatake Corporation of Japan. The temperature controller 375 may function as a two-way communication interface between the controller 380 and the temperature probe 376, for example.

Figure 4:
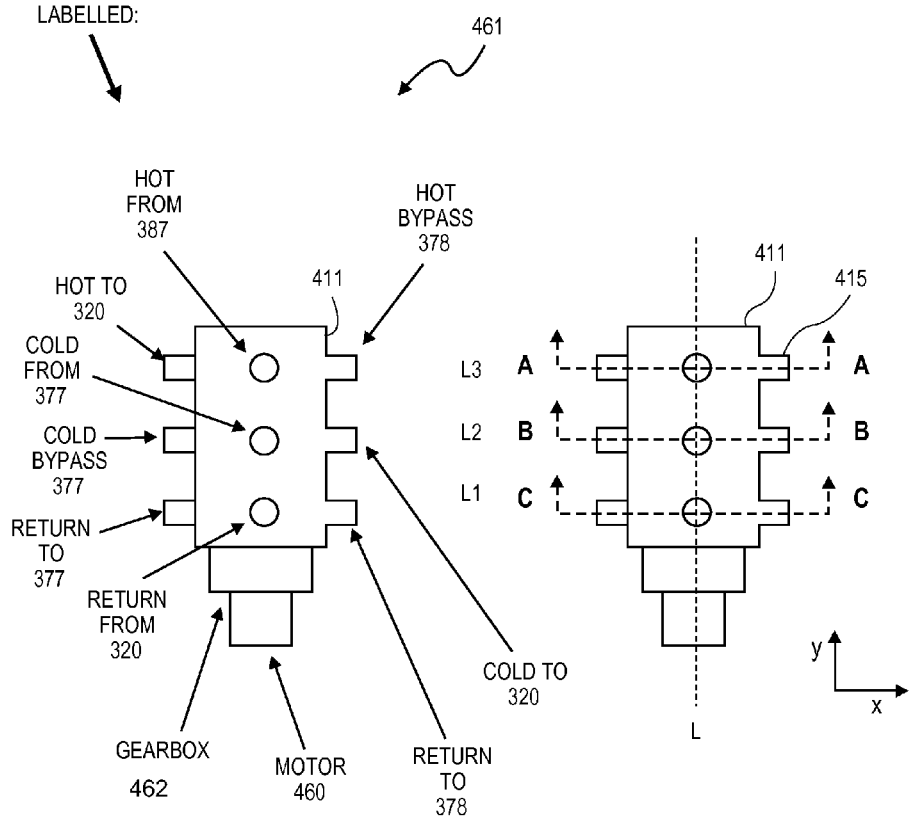
FIG. 4 is a plan view of further illustrating a stacked proportioning valve, in accordance with an embodiment of the present invention.

FIG. 4 is a plan view of further illustrating one stacked proportioning valve 461, in accordance with an embodiment of the present invention. FIGS. 5A-5E are cross-sectional views along the transverse A-A, B-B, and C-C sections denoted in FIG. 4 further illustrating states of the three parallel valve stages as the angular position of a valve rotor is varied, in accordance with an embodiment.

Generally, the stacked proportioning valve 461 includes an appropriately machined rotor disposed within a single stationary valve body 411 defining a plurality of fluidly independent cavities with multiple ports coupled to each cavity.

Figure 5A:
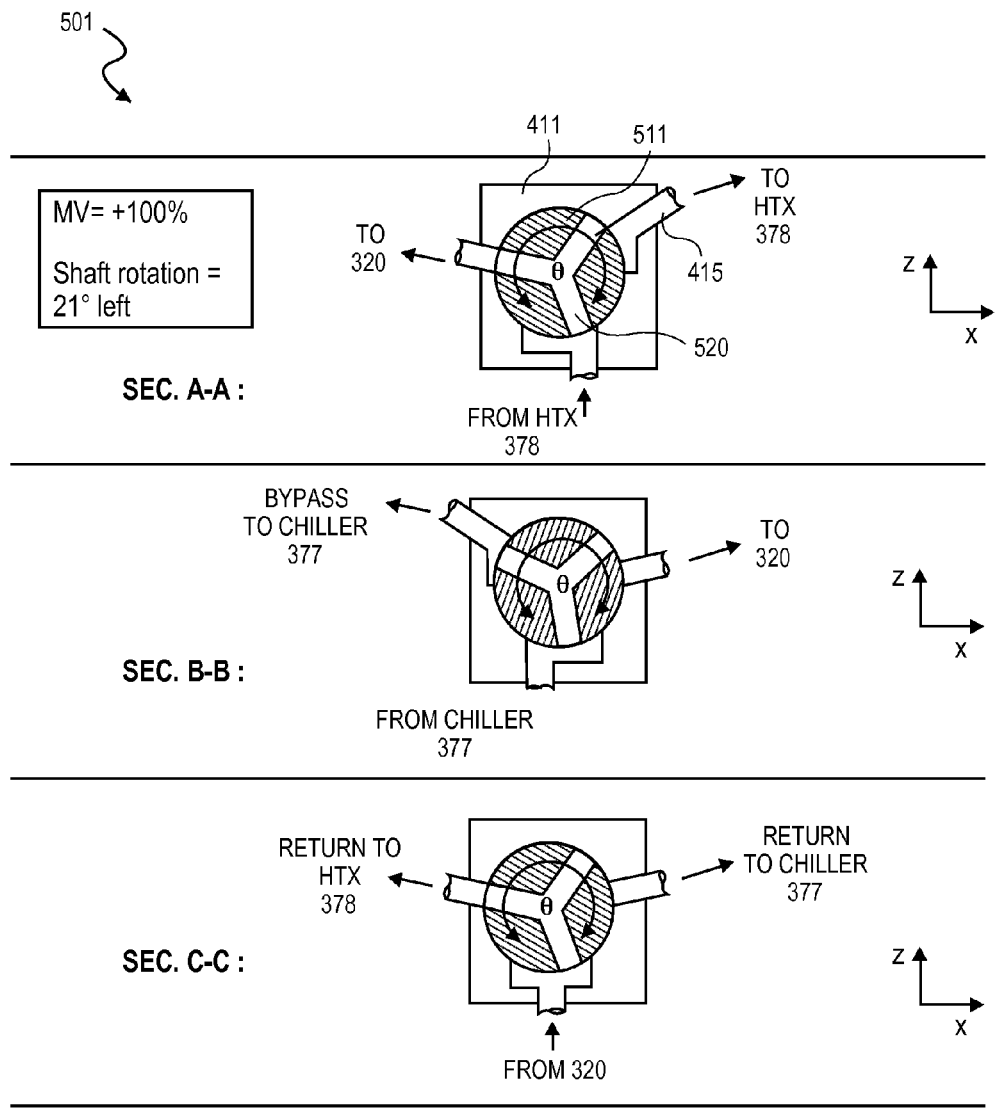
FIGS. 5A-5E are cross-sectional views along the transverse A-A, B-B, and C-C sections illustrating various states of three independent parallel valve stages as the angular position of a valve rotor is varied, in accordance with an embodiment.

As show in FIGS. 4 and 5A, the rotor 511 is cylindrical in its simplest form with a longitudinal axis L extending through the valve body 411 to have a portion of the rotor 511 disposed in each of the fluidly independent cavities. The rotor 511 is to move in a controlled way about its axis within the stationary valve body 411 (e.g., by ±21°). It should be noted the ±21° deflection angle is illustrative, with this angle variable in alternate embodiments of the invention as a matter of design. The valve body 411 bears the fittings or ports 415 that connect the valve assembly to the hot (HTX) 378 and cold chiller 377 and to the cathode (chuck) 320.

During operation, the rotor 511 moves within the valve body 411, to open and close appropriate ports 415 (e.g., with particular valve states 501, 502, 503, 504 and 505 illustrated in FIGS. 5A-5E, respectively) for heat transfer fluid to flow from the HTX 378 or the chiller 377 to a certain (dedicated) cooling zone (e.g., inner and outer ESC loops 381, 382). In an embodiment, when the stacked proportioning valve 461 is to pass little or no heat transfer fluid from the chiller 377 or HTX 378 to the chuck 320 (e.g., when the rotor 511 is at 0°), heat transfer liquid is diverted back to the chiller 377 or HTX 378 from which it originated (this flow is referred to herein as the "prime bypass" and replaces the function of the bypasses 383, 384 illustrated in FIG. 1B. In this way, the HTX 378 and chiller 377 are always permitted to output several GPM. Conversely, according to the mechanical design of the valve, when the stacked proportioning valve 461 is appropriately positioned to send a maximum flow (e.g., 3-8 GPM) from a certain chiller to the chuck 320, then the prime bypass is fully closed. As such, it is again noted that the stacked proportioning valve 461 not a mixing valve, but rather, at any given rotor angle, a finite flow of either hot or cold heat transfer fluid may be established through the chuck 320, and in the preferred embodiment, never both at the same time beyond few-ml-per-min leakage as described elsewhere herein. The prime bypass flow exists so that both the chiller 377 and HTX 378 may maintain a constant pump rate even when one of them is prevented from flowing to the chuck 320. Therefore, at any instant in time, a given zone (e.g., inner or outer) of the chuck 320 is either being heated or cooled, or neither, but not both.

Section views A-A, B-B and C-C in FIGS. 5A-5E depict the appropriate action of the stacked proportioning valve 461. The FIGS. 5A-5E depict sections through the monolithic rotor 511, thus the angular position of the sectioned heat transfer fluid flow channels 520 in each figure are nominally equal. As illustrated in section C-C, the stacked proportioning valve 461 switches flow from a given chiller back to the same chiller when that flow returns from the cathode.

Figure 5B:
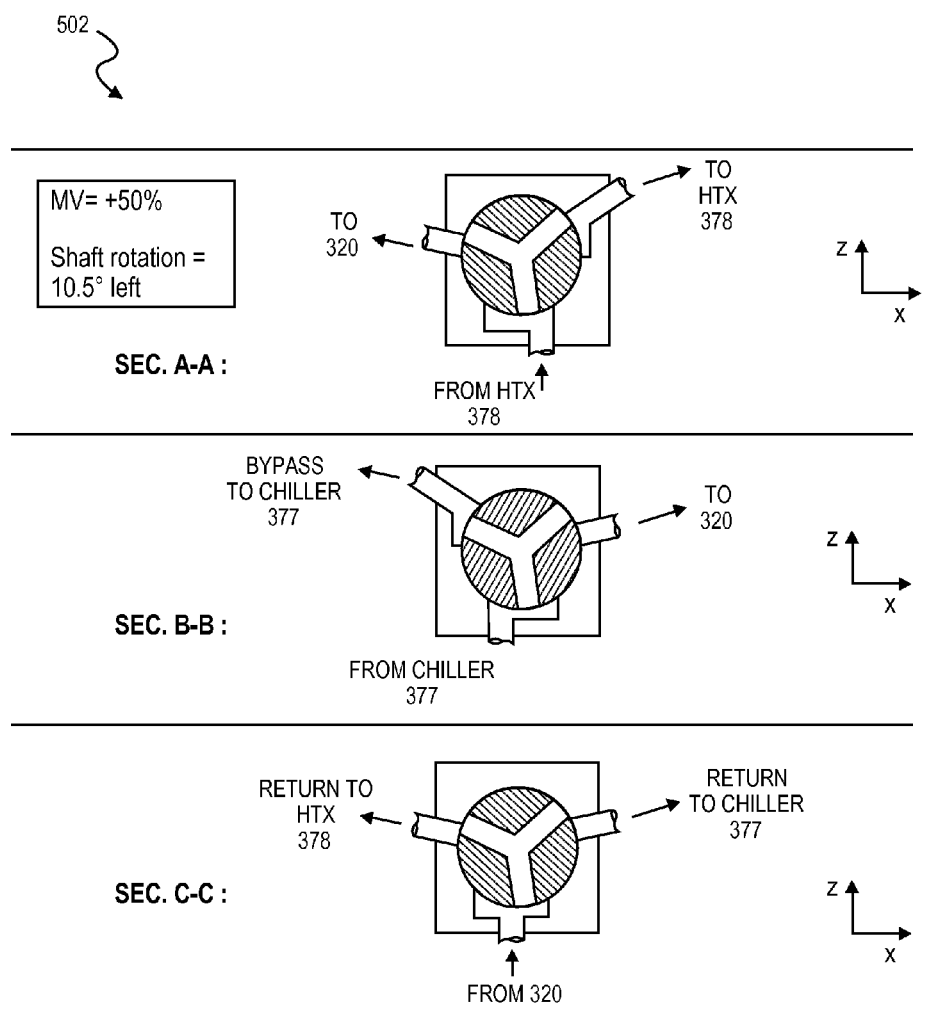
Figure 5C:
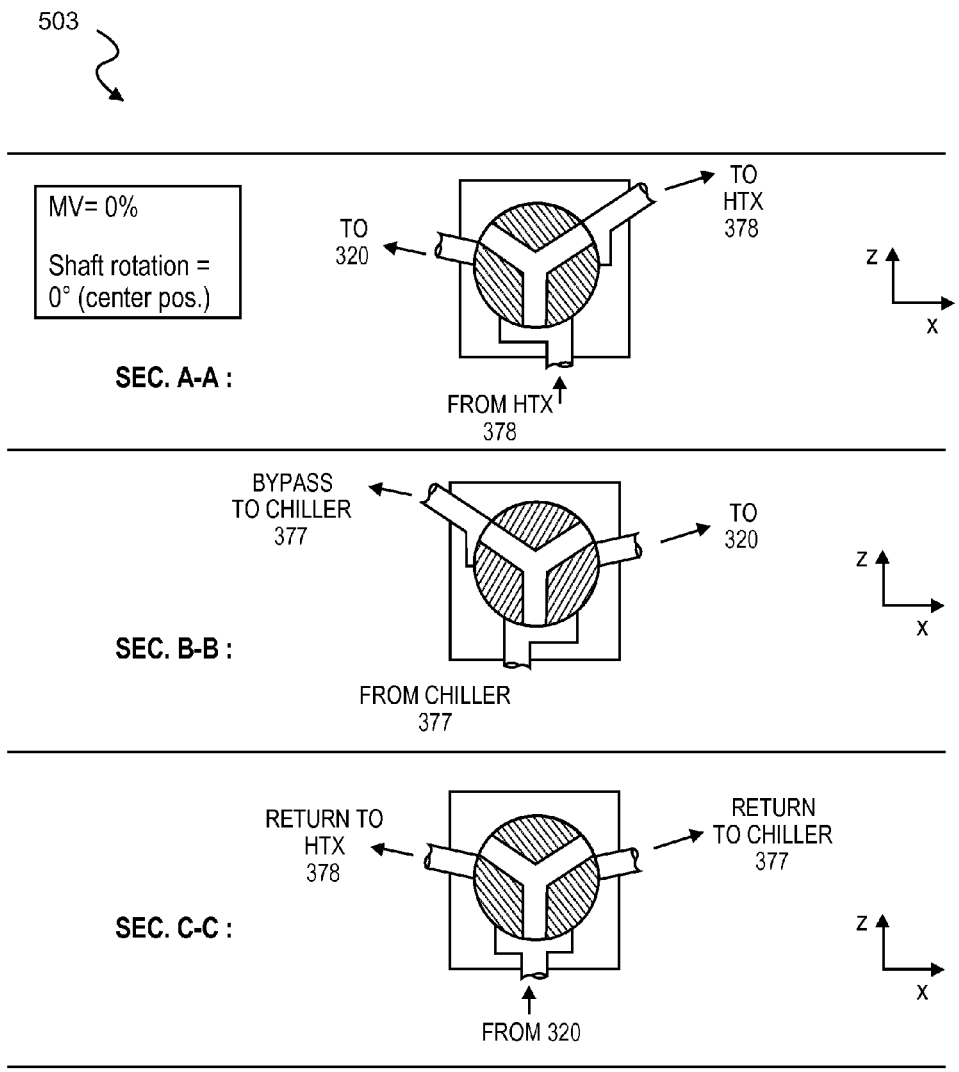
Figure 5D:
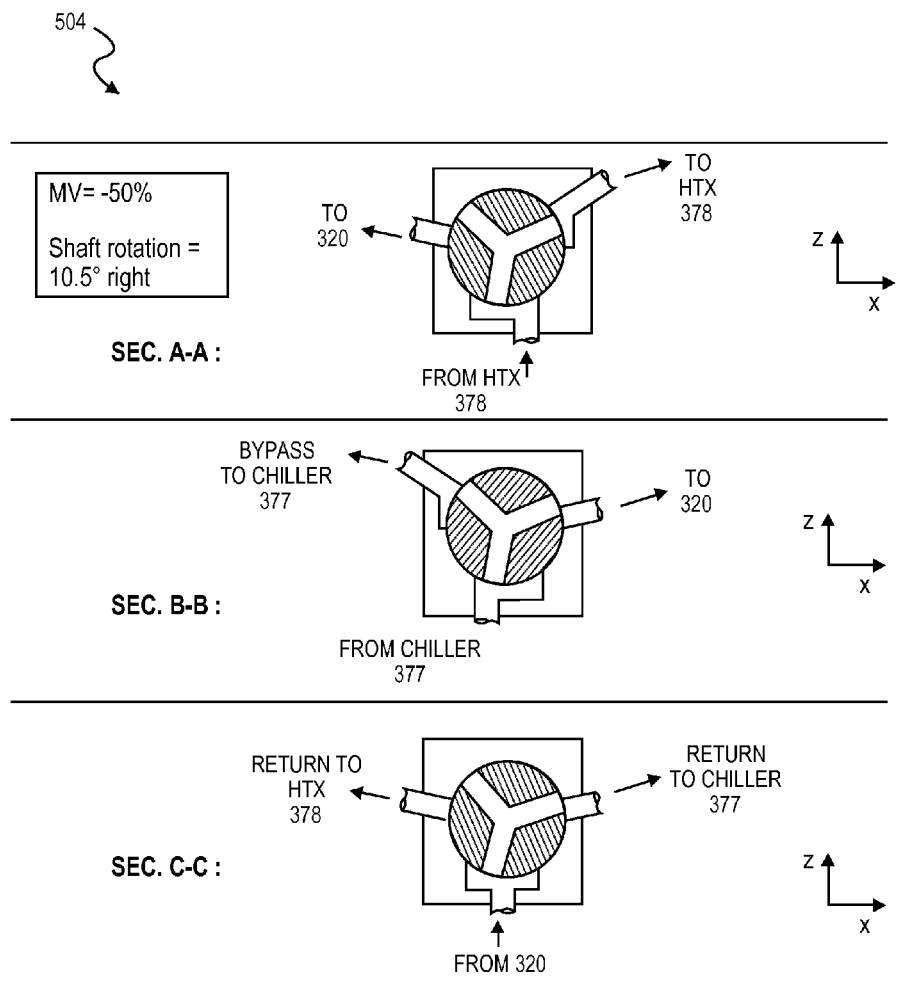
Figure 5E:
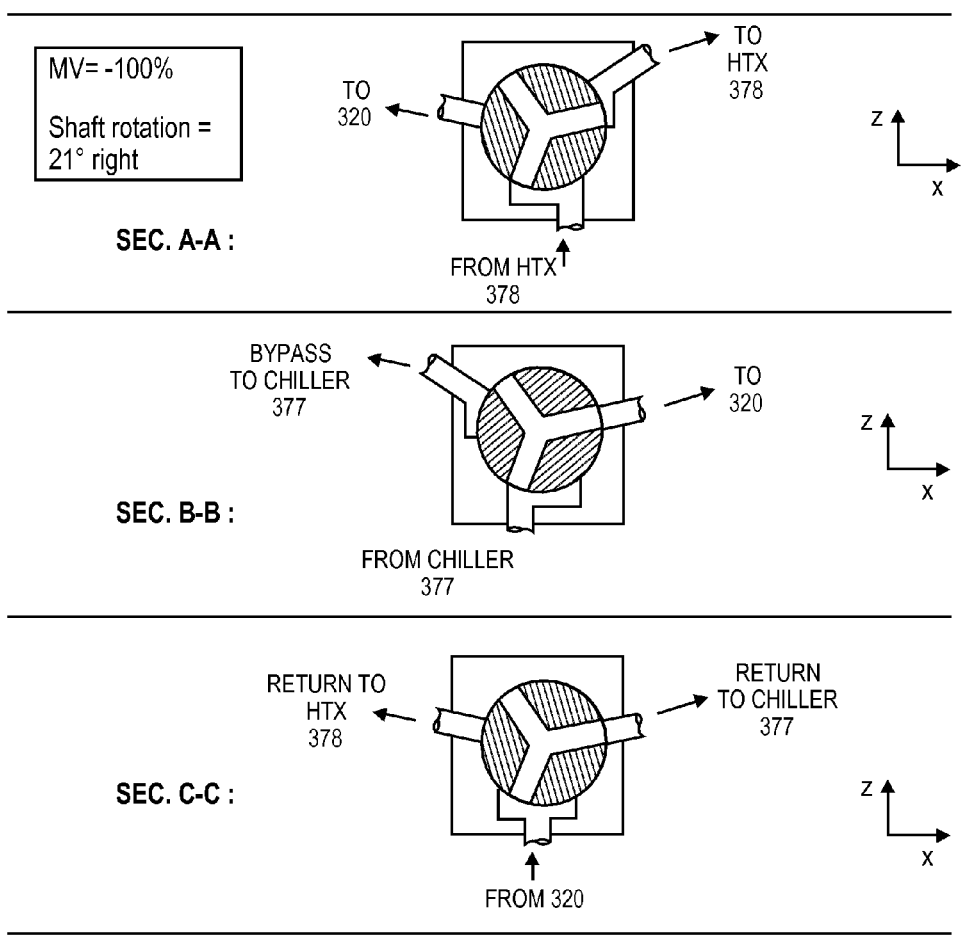

FIG. 5A illustrates the state of the stacked proportioning valve 461 referred to as "MV=+100" where full flow is sent between the chuck 230 and the HXT 378 while the chiller 377, (cold) flow is fully diverted through prime bypass. FIG. 5B illustrates the state of stacked proportioning valve 461 associated with a control command value MV=+50% where a controlled portion of hot fluid (e.g., from HTX 378) is sent to the chuck 320 while all cold fluid (e.g., from chiller 377) is shunted away from the chuck 320 by the bypass and the return from the chuck 320 is routed only back to the hot fluid source (e.g., to HTX 378). FIG. 5C illustrates the state of stacked proportioning valve 461 associated with a control command value "MV=0" where neither the chiller 377 nor the HTX 378 is supplying the cathode (chuck 320) and all flow of the chiller 377 and the HTX 378 is returned to the same chiller through prime bypass. FIG. 5D illustrates the state of stacked proportioning valve 461 associated with a control command value MV=−50% where a controlled portion of cold fluid (e.g., from chiller 377) is sent to the chuck 320 while all hot fluid (e.g., from HTX 378) is shunted away from the chuck 320 by the bypass, and the return from the chuck 320 is routed only back to the cold fluid source (e.g., to chiller 377). FIG. 5E illustrates a state associated with MV=−100, when full cold chiller flow (e.g., from chiller 377) is sent to the cathode, and all the hot chiller flow (e.g., from HTX 378) is sent to prime bypass.

In embodiments, the rotor 511 has diameter in the range of 1.25" to 3.0". The external ports 415 are approximately 0.75" O.D. Internal channels 520 are sized accordingly to avoid undesired fluid restrictions. The valve body 411 may be one piece or may be made of rigidly assembled sections, according to mechanical and manufacturing considerations known to those skilled in the art of valving design. In the exemplary embodiment, the rotor 511 and valve body 411 are the same or dissimilar metals. Plastics (e.g., PTFE) may also be utilized. The rotor 511 may be appropriately enclosed by journal bearings (e.g., 4 bearing) that seal the pressurized heat transfer fluid inside each section of the stacked proportioning valve 461. Such bearings should maintain a rotating seal with acceptably low leak rate and wear-resistance. Depending on the embodiment, the journal bearings may be Teflon, Kel-F, Vespel, graphite-filled, or molybdenum-disulfide-filled analogues thereof, and the like.

In embodiments where the chiller 377 operates between −10° C. and 80° C., depending on the application and the HTX 378 operates between 40° C. and 130° C., the components of the stacked proportioning valve 461 are toleranced accordingly for thermal expansion over this whole range. Since the stacked proportioning valve 461 will act as an equilibration path between the dissimilar temperatures, it may incorporate thermal breaks (e.g., thermally resistive materials and/or voids) to minimize conductive heat transfer through the body 411 or rotor 511. As further illustrated in FIG. 4, a motor 460 and gearbox 462 are to rigidly affixed to the rotor 511 by a drive shaft to accurately move the rotor 511 within the body 411 over the desired angular positions θ about the transverse plane, as illustrated in FIGS. 5A-5E (e.g., ±21°). The motor 460 and gearbox 462 may need to be thermally decoupled from the temperature of stacked proportioning valve 461 itself by appropriate mechanical design. The motor 460 may for example be a stepper motor, or servomotor.

Referring back to FIG. 3, the function of a controller 380 is further configured to receive the process temperature and to generate an angular MV (within ±21°) by an appropriate temperature-control algorithm and then directly actuate the motor 460 appropriately. Mechanical feedback and encoding of the rotor angle may be implemented by one of ordinary skill. These functions in the illustrated embodiment are performed by a standalone module but could also be integrated into the temperature controller 375 which also manages functions of the process chamber. Regardless of the implementation, the system 383 is to follow a process sequence of an (etch) process recipe performed by the etch system 300. A hybrid model-based/PID temperature control algorithm is utilized in a particular embodiment.

Initialization and service routines for the new temperature control hardware are performed in an appropriate fashion and can be implemented by those of ordinary skill in the art. In the course of adapting the control system, the GPM flow as a function of angular position may be calibrated and may need to be subjected to software-linearization. These tasks could be done partly by simulation but ultimately be empirical laboratory measurements. Related data collection may be needed to address chamber-matching considerations, as is generally experienced with all production tools.

In an embodiment, the stacked proportioning valve 461 has no angular position of the rotor 511 that results in dead-tight shutoff of the (~80 PSI) heat transfer fluid output pressure from the chiller 377 or HTX 378. For example, even at MV=0, a few ml/min of heat transfer fluid flow to the chuck 320 may be allowable. For such embodiments, the valve action may be made less frictional and less wear will be expected. In one such embodiment, the fluid resistance for heat transfer fluid to exit from the chuck 320 back to the HTX 378/chiller 377 reservoir through the channels depicted in section C-C are made to be slightly less than the flow resistance of (pressurized) hot and cold supply ports in sections A-A and B-B when MV=0. This will avoid a rise to ~80 PSI of the chuck channels when the chamber is idle for a long time at MV=0. Such embodiments result in a slight mixing of hot and cold chiller liquids, but at a small enough level that may be tolerable in a manufacturing environment, or require only a nominal passive leveling means between the reservoirs of the chiller 377 and HTX 378.

A leak rate of heat transfer fluid from the last journal bearing (outboard of section C-C) to an outer containment vessel may increase with wear of the stacked proportioning valve 461. The valve 461 may be designed to be a rebuildable component assembly. Optionally, the stacked proportioning valve 461 may be designed "leaky" to simplify tolerancing and manufacturability, and to take advantage of the self-lubracating properties of the heat transfer fluid. Such a scheme is akin to pistons and bearings in internal combustion engines, where an "oil sump" and a recirculating pump circulate intentionally-leaked fluids. In such embodiments, the stacked proportioning valve 461 would be disposed in a double-containment that would not normally accumulate any heat transfer fluid. For servicing, when dead-tight isolation of the chiller 377 HTX 378 from all valve components is needed, 4 manually-actuated ball valves that can be incorporated in line with both chillers' supply and return hoses. In other embodiments quick-connects may also serve an equivalent purpose at the same locations. The valve body 411 may optionally be instrumented by pressure transducers and flow transducers placed at appropriate points in the line, for example as illustrated in the schematics of FIG. 2.

Figure 2:
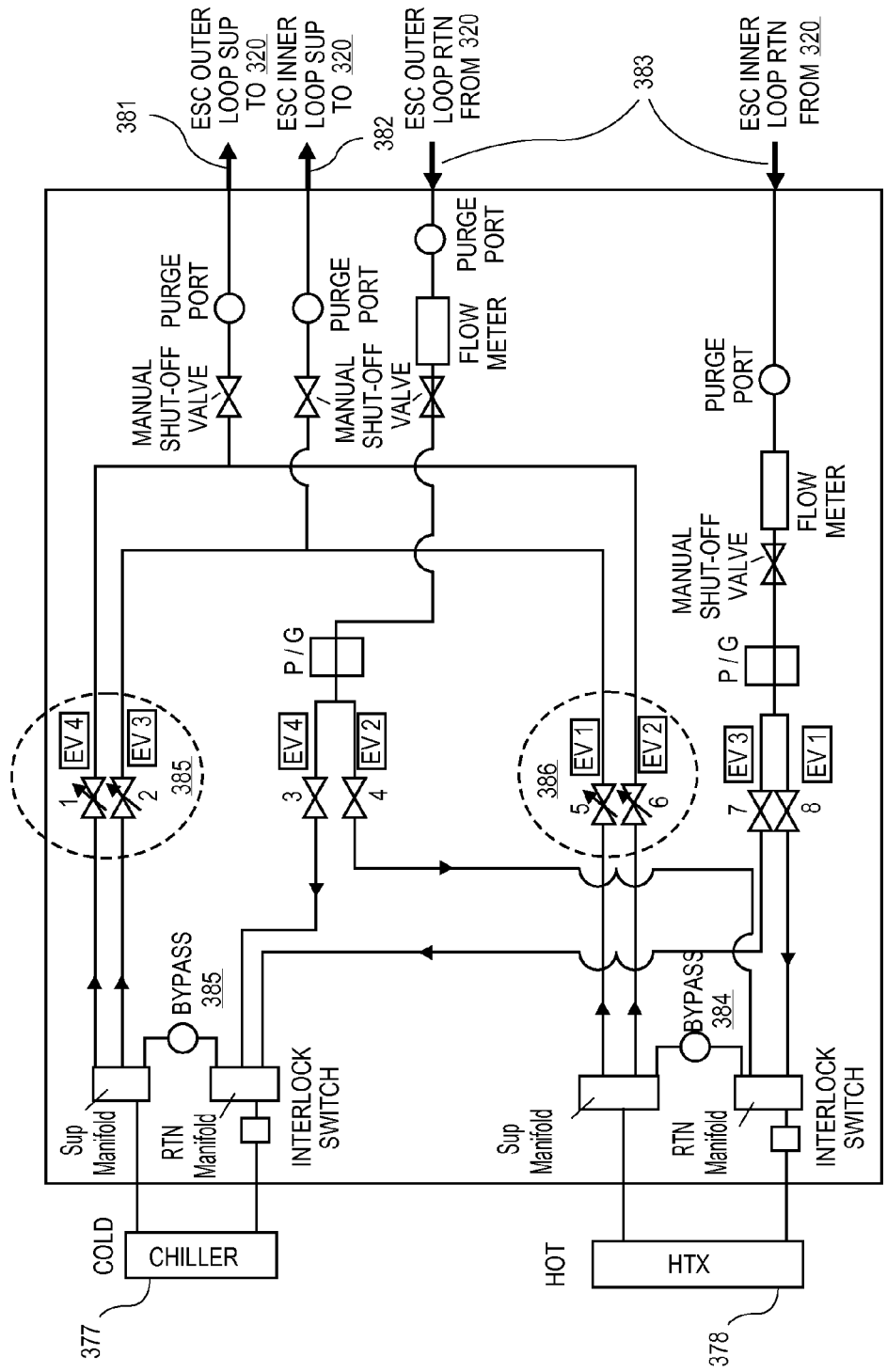
FIG. 2 illustrates a schematic of plumbing coupling a heat transfer fluid-based heat source and a heat transfer fluid-based heat sink to a workpiece supporting chuck.
Figure 6:
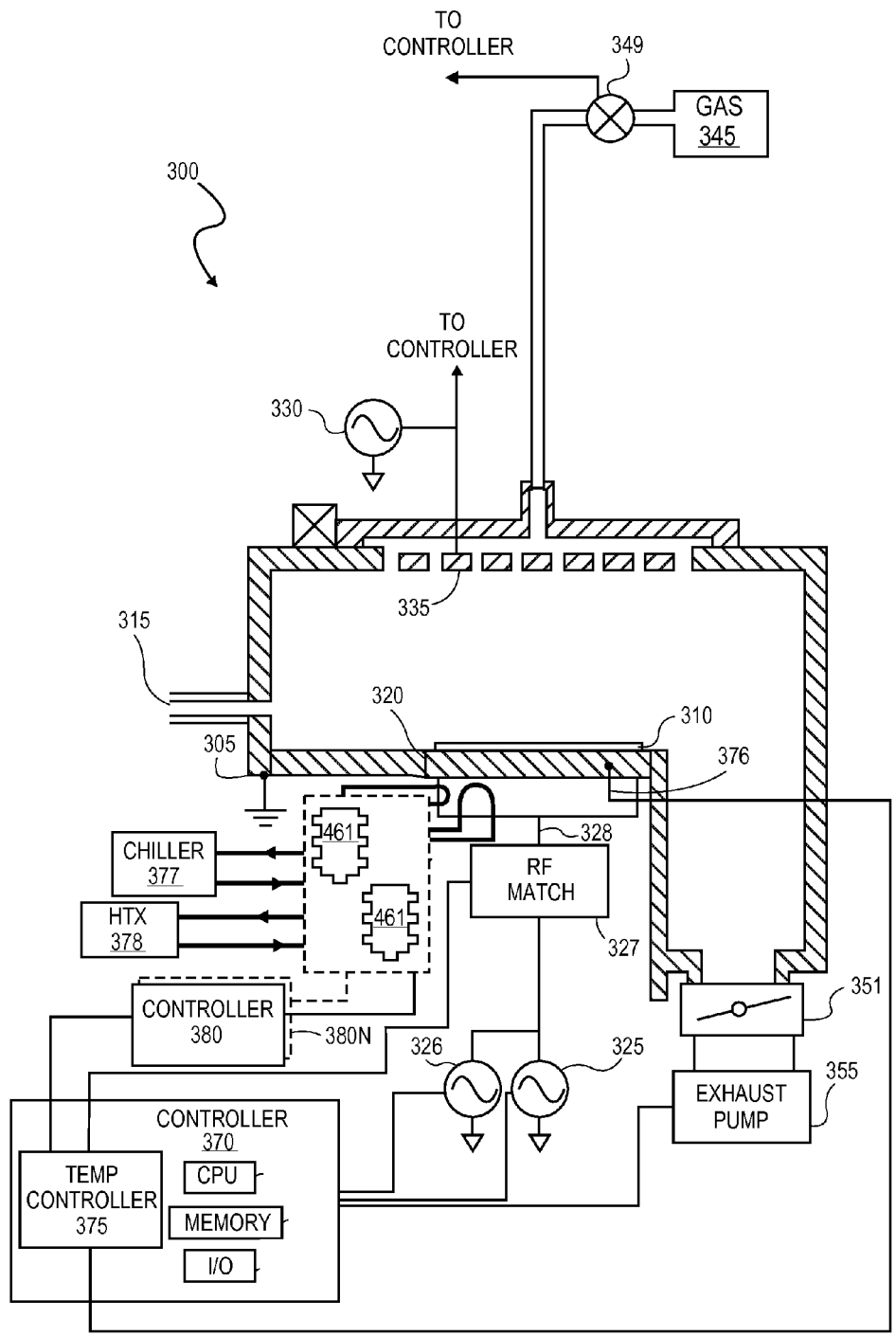
FIG. 6 illustrates a schematic of a plasma etch system including a heat transfer fluid-based heat source and a heat transfer fluid-based heat sink coupled to a workpiece supporting chuck, in accordance with an embodiment.

Accordingly, embodiments described herein effectively emulate one half of the manifolds 361 illustrated in FIG. 2, and further accomplish this task in a smoothly-varying manner without fluid hammer. As such, a pair of 2 complete motor-plus-valve assemblies, as described herein, may be utilized in place of the manifolds 361 (e.g., 461A and 461B) for embodiments where the chuck 320 as the separate inner and outer liquid channels. FIG. 6 illustrates a schematic of a plasma etch system 600 including a heat transfer fluid-based heat source and a heat transfer fluid-based heat sink coupled to a workpiece supporting chuck, in accordance with an embodiment. Generally, the plasma etch system 600 includes the components sharing like reference numbers with those of the system 100 in FIG. 1, with like reference numbers indicating a component has a same structure and/or function between the two systems. As further illustrated in FIG. 6, the etch system 600 includes at least one of the stacked proportioning valves 461, and advantageously includes at least two stacked proportioning valves 461, one for each thermal zone of the chuck 320 (inner and outer zone illustrated). A plurality of controllers 380-380N may further be provided to provide control commands to a respective one of each of the stacked proportioning valves 461 (e.g., 461A and 461B as further shown in FIG. 4), substantially as described elsewhere herein in the context of single temperature zone embodiments.

It is to be understood that the above description is illustrative, and not restrictive. For example, while flow diagrams in the figures show a particular order of operations performed by certain embodiments of the invention, it should be understood that such order may not be required (e.g., alternative embodiments may perform the operations in a different order, combine certain operations, overlap certain operations, etc.). Furthermore, many other embodiments will be apparent to those of skill in the art upon reading and understanding the above description. Although the present invention has been described with reference to specific exemplary embodiments, it will be recognized that the invention is not limited to the embodiments described, but can be practiced with modification and alteration within the spirit and scope of the appended claims. The scope of the invention should, therefore, be determined with reference to the appended claims, along with the full scope of equivalents to which such claims are entitled.

What is claimed is:

1. A stacked proportioning valve, comprising:
   a valve body having at least two sets of ports, the sets disposed at different longitudinal lengths of the valve body, each set of ports including at least three ports disposed at different angular positions in the valve body to couple to external fluid conduits;
   a rotor disposed in the valve body, the rotor having at least two sections stacked along the longitudinal length, each section comprising three fluid channels in longitudinal alignment with one of the sets of ports; and
   a drive shaft affixed to the rotor, the drive shaft to rotate the rotor over angular positions to fluidly couple together pairs of ports in each of the sets of ports synchronously as a function of the rotor's angular position.

2. The stacked proportioning valve of claim 1, wherein the valve body includes three sets of ports with each of the three sets including three ports, and wherein the rotor includes three sections stacked along the longitudinal length.

3. The stacked proportioning valve of claim 1, wherein the valve body and the rotor fluidly isolate the fluid channels of a first section with those of a second section.

4. The stacked proportioning valve of claim 1, wherein at a first angular position the rotor fluidly couples a first input port with a first output port in the first set of ports while fluidly coupling the a second input port with a first output port in the second set of ports and while fluidly coupling a third input port with a first output port in the third set of ports.

5. The stacked proportioning valve of claim 4, wherein at a second angular position the rotor fluidly couples the first input port with a second output port in the first set of ports while fluidly coupling the second input port with a second output port in the second set of ports and while fluidly coupling the third input port with a second output port in the third set of ports.

6. The stacked proportioning valve of claim 5, wherein at a third angular position the rotor fluidly couples the first input port with both the first and second output ports in the first set of ports while fluidly coupling the second input port with only the second output port in the second set of ports and while fluidly coupling the third input port with only the second output port in the third set of ports.

7. A plasma processing apparatus, comprising:
   a process chamber including a chamber temperature controlled chamber component;
   a first heat transfer fluid reservoir controlled to a first temperature;
   a second heat transfer fluid reservoir controlled to a second temperature; and supply lines and return lines coupling the first and second heat transfer fluid reservoirs to the chamber component through a stacked proportioning valve for conducting heat transfer fluid at the first or second temperature to the chamber component, wherein the stacked proportioning valve further comprises:
- a valve body having at least two sets of ports, the sets disposed at different longitudinal lengths of the valve body, each set of ports including at least three ports disposed at different angular positions in the valve body to couple to the supply and return lines;
- a rotor disposed in the valve body, the rotor having at least two sections stacked along the longitudinal length, each section comprising three fluid channels in longitudinal alignment with one of the sets of ports; and
- a drive shaft affixed to the rotor, the drive shaft to rotate the rotor over angular positions to fluidly couple together pairs of ports in each of the sets of ports synchronously as a function of the rotor's angular position to apportion heat transfer fluid at the first or second temperature to the chamber component.

8. The plasma processing apparatus of claim 7, wherein the stacked proportioning valve further comprises:
a valve body having three sets of ports, wherein a first set of ports includes:
- a first output port coupled to the supply line of the chuck;
- a second output port coupled to the first heat transfer fluid reservoir; and
- a first input port coupled to the first heat transfer fluid reservoir;

wherein a second set of ports includes:
- a third output port coupled to the supply line of the chuck;
- a fourth output port coupled to the second heat transfer fluid reservoir; and
- a second input port coupled to the second heat transfer fluid reservoir; and wherein a third set of ports includes:
- a third input port coupled to the return line of the chuck;
- a fifth output port coupled to the first heat transfer fluid reservoir; and
- a sixth output port coupled to the second heat transfer fluid reservoir; and wherein the rotor is to fluidly couple together each of the first, second, and third input port to at least one of the output ports in each of the sets of ports synchronously as a function of the rotor's angular position.

9. The plasma processing apparatus of claim 7, wherein the chamber component is a chuck configured to support a workpiece during processing.

10. The plasma processing apparatus of claim 7, further comprising:
a temperature controller coupled to the stacked proportioning valve, the controller to provide a drive signal to a motor coupled to the drive shaft, the drive signal based on a sensed temperature associated with the chuck.

11. The plasma processing apparatus of claim 7, wherein the chuck further comprises a plurality of independently controllable thermal zones, and wherein the stacked proportioning valve is replicated for each of the thermal zones to apportion heat transfer fluid at the first or second temperatures to each of the thermal zones.

12. The plasma processing apparatus of claim 7, wherein the drive shaft is to rotate the rotor to a first angular position to fluidly couple a supply line to the chuck with the first heat transfer fluid reservoir through the first set of ports while coupling the second heat transfer fluid reservoir to a bypass line returning to the second heat transfer fluid reservoir through the second set of ports, and while coupling a return line from the chuck to the first heat transfer fluid reservoir through the third set of ports.

13. The plasma processing apparatus of claim 12, wherein the drive shaft is to rotate the rotor to a second angular position to fluidly couple the supply line to the chuck with the second heat transfer fluid reservoir through the second set of ports while coupling the first heat transfer fluid reservoir to a bypass line returning to the first heat transfer fluid reservoir through the first set of ports, and while coupling a return line from the chuck to the second heat transfer fluid reservoir through the third set of ports.

14. The plasma processing apparatus of claim 13, wherein the drive shaft is to rotate the rotor to a third angular position to fluidly couple the supply line to the chuck with the second heat transfer fluid reservoir and fluidly couple the second heat transfer fluid reservoir to a bypass line returning to the second heat transfer fluid reservoir through the second set of ports while coupling the first heat transfer fluid reservoir to the bypass line returning to the first heat transfer fluid reservoir through the first set of ports, and while coupling the return line from the chuck to the second heat transfer fluid reservoir through the third set of ports.

15. A method of controlling a temperature of the component in a plasma processing apparatus, the method comprising:
sensing a temperature of a chamber component in a process chamber;
controlling a first heat transfer fluid reservoir to a first temperature;
controlling a second heat transfer fluid reservoir to a second temperature; and
transporting heat transfer fluid from the first and second heat transfer fluid reservoirs to the chamber component through a stacked proportioning valve controlled based on the sensed temperature, wherein the stacked proportioning valve further comprises:
- a valve body having at least two sets of ports, the sets disposed at different longitudinal lengths of the valve body, each set of ports including at least three ports disposed at different angular positions in the valve body to couple to the supply and return lines;
- a rotor disposed in the valve body, the rotor having at least two sections stacked along the longitudinal length, each section comprising three fluid channels in longitudinal alignment with one of the sets of ports; and
- apportioning the relative amounts of heat transfer fluid at the first and second temperatures by rotating the rotor over angular positions to fluidly couple together pairs of ports in each of the sets of ports synchronously as a function of the rotor's angular position.

16. The method of claim 15, wherein the apportioning further comprises rotating the rotor to a first angular position to fluidly couple a supply line to the chuck with the first heat transfer fluid reservoir through the first set of ports while coupling the second heat transfer fluid reservoir to a bypass line returning to the second heat transfer fluid reservoir through the second set of ports, and while coupling a return line from the chuck to the first heat transfer fluid reservoir through the third set of ports.

17. The method of claim 15, wherein the apportioning further comprises rotating the rotor to a second angular position to fluidly couple the supply line to the chuck with the second heat transfer fluid reservoir through the second set of ports while coupling the first heat transfer fluid reservoir to a bypass line returning to the first heat transfer fluid reservoir through the first set of ports, and while coupling a return line from the chuck to the second heat transfer fluid reservoir through the third set of ports.

18. The method of claim 15, wherein the apportioning further comprises rotating the rotor to a third angular position to fluidly couple the supply line to the chuck with the second heat transfer fluid reservoir and fluidly couple the second heat transfer fluid reservoir to a bypass line returning to the second heat transfer fluid reservoir through the second set of ports while coupling the first heat transfer fluid reservoir to the bypass line returning to the first heat transfer fluid reservoir through the first set of ports, and while coupling the return line from the chuck to the second heat transfer fluid reservoir through the third set of ports.

19. The method of claim 15, wherein the stacked proportioning valve further comprises:
a valve body having three sets of ports, wherein a first set of ports includes:
a first output port coupled to the supply line of the chuck;
a second output port coupled to the first heat transfer fluid reservoir; and
a first input port coupled to the first heat transfer fluid reservoir;
wherein a second set of ports includes:
a third output port coupled to the supply line of the chuck;
a fourth output port coupled to the second heat transfer fluid reservoir; and
a second input port coupled to the second heat transfer fluid reservoir; and
wherein a third set of ports includes:
a third input port coupled to the return line of the chuck;
a fifth output port coupled to the first heat transfer fluid reservoir; and
a sixth output port coupled to the second heat transfer fluid reservoir; and
wherein the rotor is to fluidly couple together each of the first, second, and third input port to at least one of the output ports in each of the sets of ports synchronously as a function of the rotor's angular position.

20. The method of claim 18, wherein the chamber component is a chuck configured to support a workpiece during processing.

* * * * *